US009421925B2

(12) United States Patent
Souma

(10) Patent No.: US 9,421,925 B2
(45) Date of Patent: Aug. 23, 2016

(54) POWER DEVICE

(71) Applicant: Renesas Electronics Corporation, Kawasaki-shi, Kanagawa (JP)

(72) Inventor: Osamu Souma, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/192,403

(22) Filed: Feb. 27, 2014

(65) Prior Publication Data
US 2014/0180540 A1 Jun. 26, 2014

Related U.S. Application Data

(63) Continuation of application No. 13/738,504, filed on Jan. 10, 2013, now Pat. No. 8,698,549.

(30) Foreign Application Priority Data

Feb. 23, 2012 (JP) ................................. 2012-037074

(51) Int. Cl.
*G06F 7/00* (2006.01)
*B60R 16/033* (2006.01)
(Continued)

(52) U.S. Cl.
CPC ............ *B60R 16/033* (2013.01); *H01H 37/761* (2013.01); *H02J 7/0031* (2013.01); *H02J 7/34* (2013.01); *H02J 2007/0039* (2013.01)

(58) Field of Classification Search
CPC ...... H01H 37/761; G11C 17/18; G11C 17/16; H01L 23/5256
USPC ......... 327/525, 403, 310, 530, 108–112, 404; 326/82, 83; 701/36; 363/56.03, 56.04, 363/56.05, 56.06, 56.07, 56.08, 56.09, 56.1, 363/56.11

See application file for complete search history.

(56) References Cited

U.S. PATENT DOCUMENTS 5,663,858 A * 9/1997 Etter ............................... 361/28
5,859,772 A * 1/1999 Hilpert ....................... 363/56.03
(Continued)

FOREIGN PATENT DOCUMENTS

JP         8116677 A     5/1996
JP      9-266226 A    10/1997
(Continued)

OTHER PUBLICATIONS

Communication dated Apr. 28, 2015, issued by the Japan Patent Office in corresponding Japanese Application No. 2012-037074.

*Primary Examiner* — Lincoln Donovan
*Assistant Examiner* — Thomas Skibinski
(74) *Attorney, Agent, or Firm* — Sughrue Mion, PLLC

(57) ABSTRACT

A power device possesses a built-in fuse function and can continue to normally operate after a short circuit failure. The power device includes a plurality of output cells, a plurality of bonding wires provided corresponding to the output cells, and a control terminal driving circuit. Each of the output cells includes an output transistor. First side electrodes of the output transistors are commonly coupled to a first power source. Each of second side electrodes of the output transistors is coupled to an output terminal through the corresponding bonding wire. The control terminal driving circuit supplies a drive signal to the control terminals of the individual output transistors to control the output transistors. Each of the bonding wires is designed to be fused and cut if the output transistor included in the corresponding output cell fails and is shorted.

14 Claims, 14 Drawing Sheets

(51) Int. Cl.
*H01H 37/76* (2006.01)
*H02J 7/00* (2006.01)
*H02J 7/34* (2006.01)

(56) References Cited

U.S. PATENT DOCUMENTS

| | | | |
|---|---|---|---|
| 6,515,531 | B2 | 2/2003 | Ruff et al. |
| 6,949,961 | B2 | 9/2005 | Robb et al. |
| 2005/0077838 | A1 | 4/2005 | Blumel |
| 2009/0034306 | A1* | 2/2009 | Inaba ................... B60L 11/18 363/131 |
| 2010/0155838 | A1* | 6/2010 | Jung ............................ 257/334 |

FOREIGN PATENT DOCUMENTS

| | | |
|---|---|---|
| JP | 10-12806 A | 1/1998 |
| JP | 2006170878 A | 6/2006 |
| JP | 201073769 A | 4/2010 |
| JP | 2011-135093 A | 7/2011 |

* cited by examiner

POWER DEVICE

CROSS-REFERENCE TO RELATED APPLICATIONS

This is a continuation of application Ser. No. 13/738,504, filed Jan. 10, 2013, which claims the benefit of priority from Japanese Patent Application No. 2012-037074 filed on Feb. 23, 2012 including the specification, drawings and abstract, which are incorporated herein by reference in their entirety.

BACKGROUND

The present invention relates to a power device.

Electrical equipment is designed to supply power to a load from a power source such as a battery. In order to control the power to be supplied, a power device is provided between the battery and the load. When the power device fails and is shorted, an excess current flows and the electrical system may be damaged. Thus, a mechanical fuse is provided in the electrical equipment in the case where the electrical system fails due to a short circuit.

In relation to the power device, Japanese Unexamined Patent Publication No. Hei 10(1998)-12806 discloses a semiconductor device. The semiconductor device includes: an insulating substrate having a conductor pattern; a semiconductor chip provided on the insulating substrate and having an electrode; a case surrounding the insulating substrate; a bonding wire that is electrically coupled to at least one of the conductor pattern on the insulating substrate, and the electrode of the semiconductor chip; and an arc-extinguishing material with which the case is filled to seal at least the bonding wire. In this semiconductor device, a predetermined bonding wire is fused and cut when an excess current flows. The bonding wire is sealed with the arc-extinguishing material in order to prevent fire or explosion caused by the fusing of the bonding wire.

As another example of the related art, Japanese Unexamined Patent Publication No. Hei 9(1997)-266226 discloses a high current semiconductor device. In the high current semiconductor device, a large number of unit cells are arranged in parallel. At least one of the main electrode regions of the semiconductor device is divided into at least two separate bonding pad regions. One end of each bonding wire is coupled to the bonding pad. The other end of each bonding wire is coupled to a common external terminal. Wire open failure is detected by measuring the ON resistance of the semiconductor device.

Further, as still another example of the related art, Japanese Unexamined Patent Publication No. 2011-135093 discloses a hot swap protection device. The hot swap protection device includes a split-gate switching device including a first metal-oxide-semiconductor field-effect transistor (MOSFET) device with a first gate electrode, as well as a second MOSFET device with a second gate electrode. The hot swap protection device also includes a current limiting device coupled to the first gate electrode to control the first MOSFET device during operation in the current limiting mode. Further, the hot swap protection device includes a comparator device coupled to the first and second control electrodes to turn on the second MOSFET device during operation in the current non-limiting mode.

SUMMARY

As described above, when the mechanical fuse is used for the case where the power device is shorted, the region occupied by the electrical equipment increases due to the mechanical fuse.

On the other hand, in the semiconductor device described in Japanese Unexamined Patent Publication No. Hei 10(1998)-12806, the bonding wire is used as the fuse. In other words, the fuse function is built in the power device, so that the size of the electrical equipment can be reduced. However, once the bonding wire is fused and cut, then the power device may not operate normally.

Note that Japanese Unexamined Patent Publication No. Hei 9(1997)-266226 discloses a method of detecting that the wire is open, but does not explain the fuse function. Further, Japanese Unexamined Patent Publication No. 2011-135093 discloses the current limiting mode and current non-limiting mode, but does not explain the fuse function. Other objects, advantages and novel features of the present invention will be apparent from the following detailed description when read in conjunction with the appended claims and the drawings attached hereto.

In one embodiment, there is provided a power device including a plurality of output cells, a plurality of bonding wires provided corresponding to the respective output cells, and a control terminal driving circuit. The individual output cells include an output transistor. First side terminals of the output transistors are commonly coupled to a first power source. Each of second side terminals of the output transistors is coupled to an output terminal through each of the corresponding bonding wirers. The control terminal driving circuit supplies a drive signal to a control terminal of the individual output transistors to control the output transistors. Each of the bonding wires is designed to be fused and cut if the output transistor included in the corresponding output cell fails and is shorted.

According to the one embodiment, there is provided a power device with a built-in fuse function and can continue to normally operate after a short circuit failure.

DETAILED DESCRIPTION

Hereinafter, preferred embodiments of the present invention will be described with reference to accompanying drawings.

First Embodiment

Figure 1:
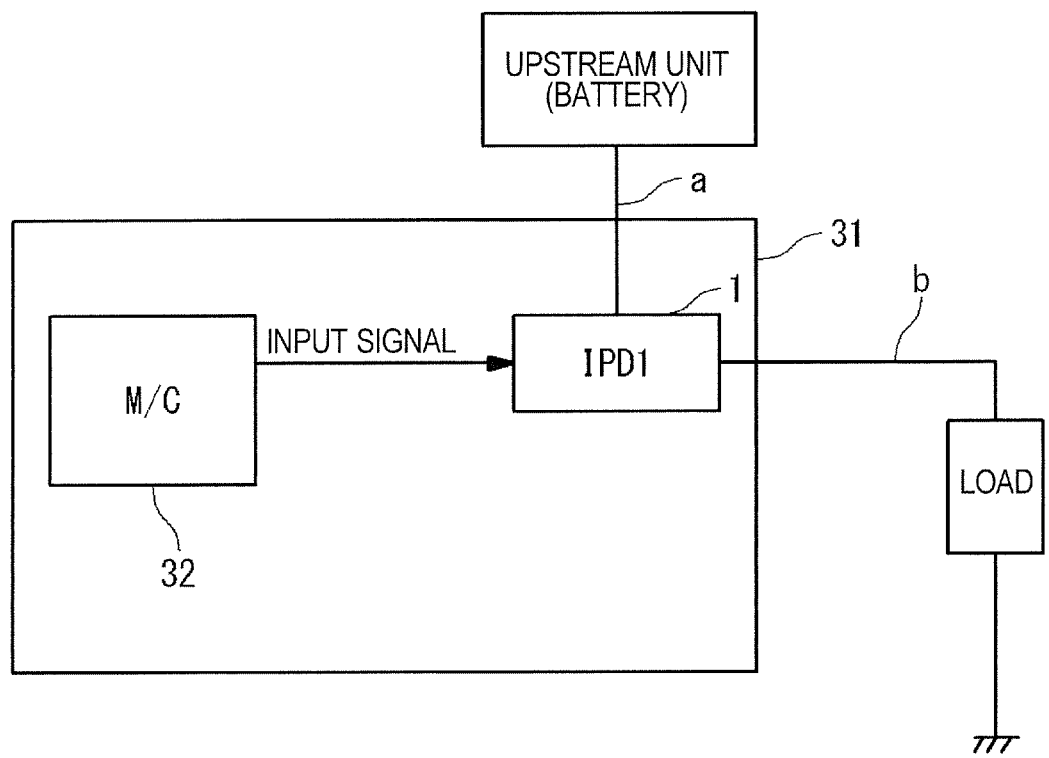
FIG. 1 is a block diagram of a power control unit according to a first embodiment.

FIG. 1 is a block diagram of a power control unit 31 including a power device 1 according to a first embodiment. First, the outline of the first embodiment will be described with reference to FIG. 1.

The power control unit 31 is, for example, an automobile engine control unit (ECU). The power control unit 31 is used to control power supplied from an upstream unit (or a battery) to a load (for example, an engine). The power control unit 31 includes a microcomputer 32 (M/C) in addition to the power device 1. For example, the power device 1 may be a so-called intelligent power device IPD1 including a power semiconductor device such as MOSFET or insulated gate bipolar transistor (IGBT), a control circuit, a driving circuit, and the like. The power device 1 is coupled to the upstream unit through a line a, and coupled to the load through a line b. The microcomputer 32 has a function of controlling the power device 1. The microcomputer 32 supplies an input signal to the power device 1 to control the power device 1. The power device 1 enables or disables the supply of power to the load from the battery based on the input signal.

Here, the power control unit 31 should have countermeasures if the power device 1 fails to operate properly. One failure of the power device 1 is a short circuit. In general, as a countermeasure when the power device 1 fails due to a short circuit, a mechanical fuse and the like is provided in the line a. However, in this embodiment, the fuse function is built in the power device 1. In addition, the configuration of the power device 1 is designed to maintain the operation even if the power device 1 fails due to a short circuit. For this reason, the mechanical fuse can be omitted in the line a.

Now the power device 1 will be described in detail below.

Figure 2:
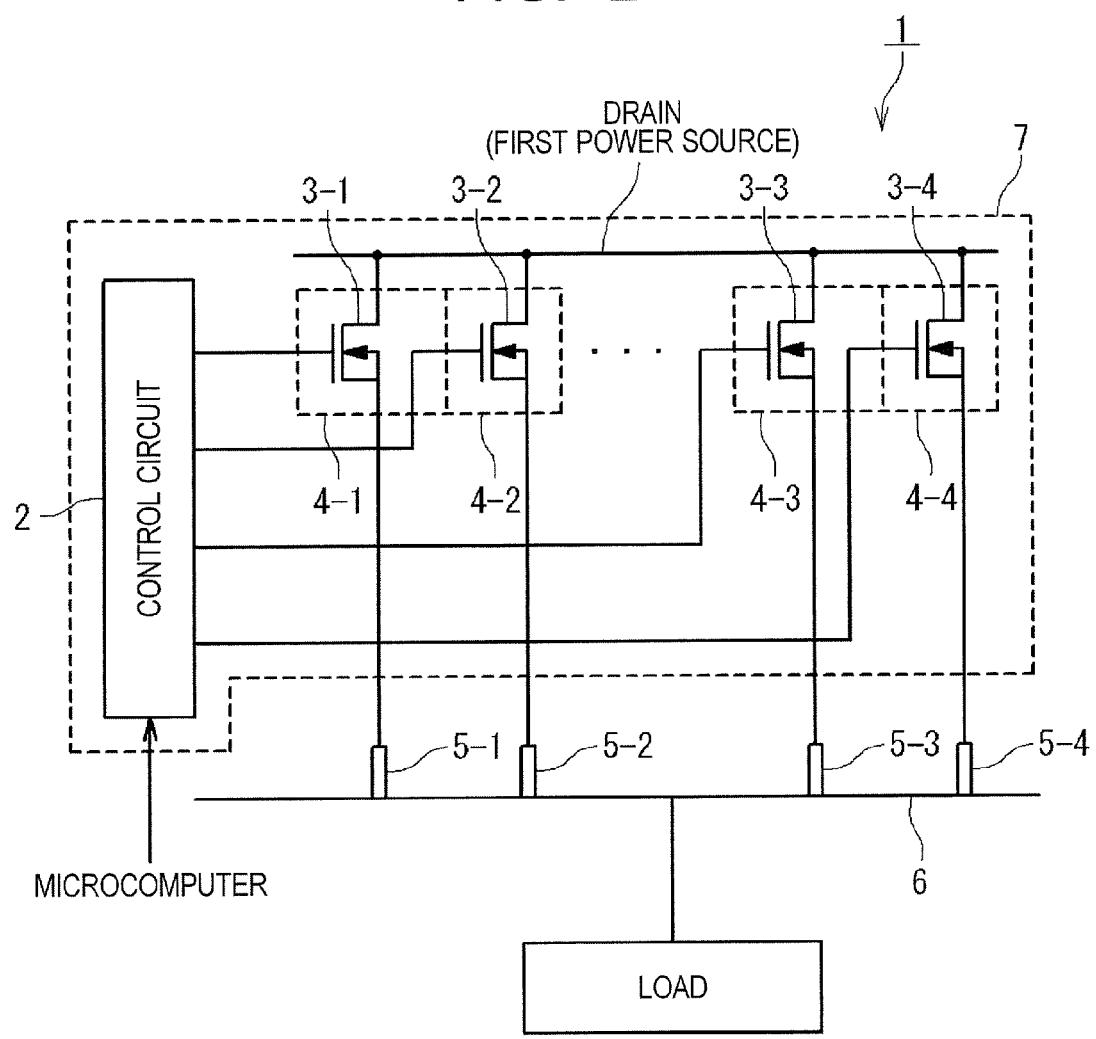
FIG. 2 is a schematic diagram of a power device according to the first embodiment.

FIG. 2 is a schematic diagram of the power device 1 according to the first embodiment. The power device 1 includes a control circuit 2, a plurality of output cells 4 (4-1, 4-2, and so on), and a plurality of bonding wires 5 (5-1, 5-2, and so on). Here, the control circuit 2 and the output cells 4 are provided in a semiconductor chip 7 mounted on a lead frame 6. Further, the bonding wires 5 are provided so that the output cells 4 are coupled to the lead frame 6.

The output cells 4 (4-1, 4-2, and so on) are provided with output transistors 3 (3-1, 3-2, and so on), respectively. The drain electrodes (first side electrodes) of the output transistors 3 are commonly coupled to a first power source (an upstream unit, a battery, and the like).

The bonding wires 5 are provided corresponding to the respective output cells 4. One end of each of the bonding wires 5 is coupled to the source electrode (a second side electrode) of the output transistor 3 included in the corresponding output cell 4. The other side of the bonding wire 5 is coupled to the lead frame 6 and is electrically coupled to the load through the line b.

The control circuit 2 has a function of controlling the output cells 4. The control circuit 2 receives an input signal from the microcomputer. Then, the control circuit 2 controls the gate (control terminal) voltage of the output transistors 3 (3-1, 3-2, and so on) based on the input signal. In this way, the ON/OFF of the individual output transistors 3 is controlled. The control circuit 2 controls the output transistors 3 so that the ON and OFF states are switched at the same time. When the output transistors 3 are in the ON state, the power is supplied to the load from the first power source through the output transistors 3, the bonding wires 5, and an output terminal 6b (see FIG. 4). On the other hand, when the output transistors 3 are in the OFF state, the power supply to the load is interrupted.

Here, the failure of the power device 1 is often caused by a short circuit due to an unexpected surge. In other words, when an unexpected surge occurs, one or a plurality of the output transistors 3 (3-1, 3-2, and so on) may be destroyed and shored. If any of the output transistors 3 is shorted, the current is concentrated in the shorted output transistor 3 and continues to flow in the OFF state. Thus, in this embodiment, each of the bonding wirers 5 (5-1, 5-2, and so on) is designed so that the corresponding bonding wire 5 (5-1, for example) is fused and cut if the current is concentrated in any of the output transistor 3 (3-1, for example) and flows through it.

Figure 3:
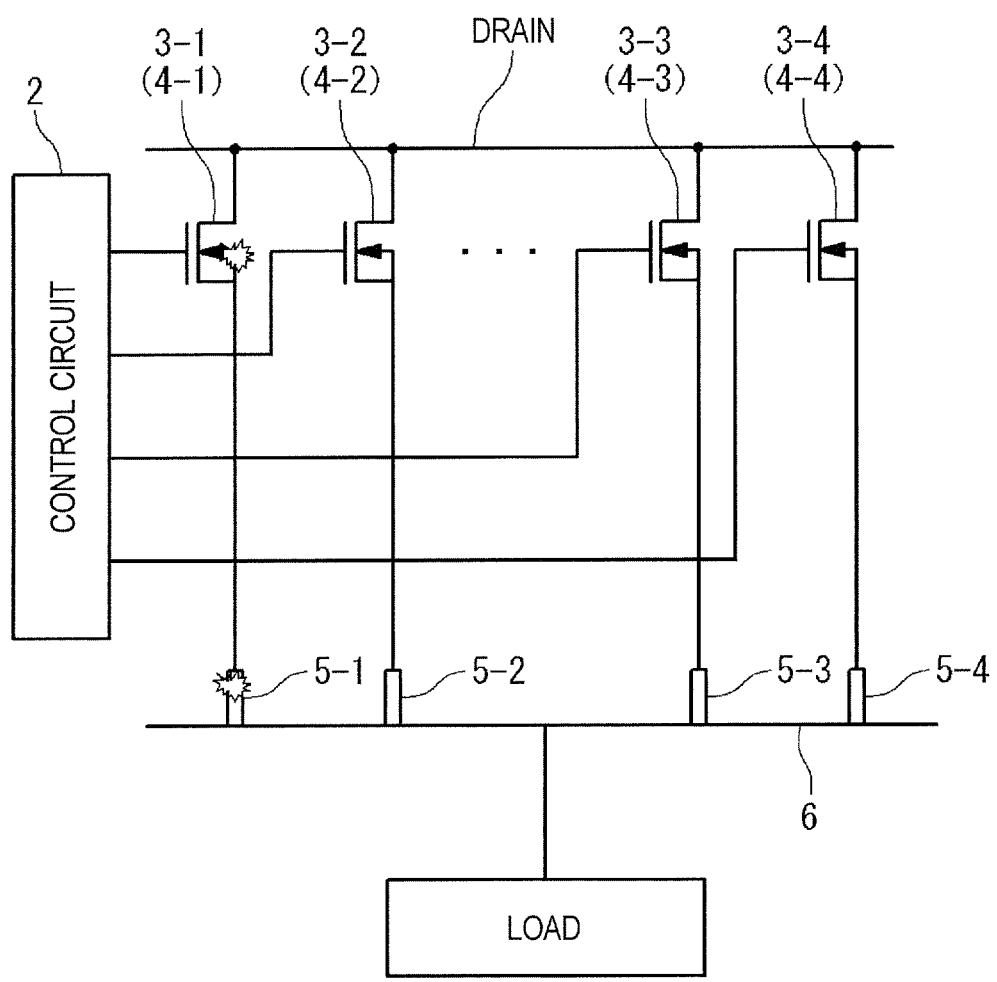
FIG. 3 is a schematic diagram of the power device in the occurrence of a failure.

FIG. 3 is a schematic diagram of the power device 1 when a failure occurs. In the example shown in FIG. 3, the output transistor 3-1 in the output cell 4-1 of the output cells 4 (4-1 to 4-4) has been destroyed. In the ON state, the current flows through the output transistors 3 in all the cells 4. The damage is not significantly increased, so that the power device 1 normally performs the ON-state operation even if the output transistor 3-1 is destroyed. On the other hand, in the OFF state, the current flows through the output transistor 3-1 only in the output cell 4-1, so that the current is concentrated in the output transistor 3-1 and flows through it. As a result, the bonding wire 5-1 coupled to the output cell 4-1 is fused and cut. This prevents the current from flowing in the failed cell 4-1. Thus, the current does not continue to flow to the load from the first power source through the output transistor 3-1 that has failed due to a short circuit in the OFF state. Note that in the ON state after the bonding wire 5-1 is cut, the power is supplied to the load from the first power source through the cells (4-2 to 4-4) other than the failed cell 4-1. That is, only the failed cell 4-1 does not function, while the function of the power device 1 is maintained by the remaining normal cells (4-2 to 4-4).

In other words, according to this embodiment, the output cells 4 are used with the respective bonding wires, so that if any of the output cells 4 fails due to a short circuit, the corresponding bonding wire 5 is fused and cut. With this configuration, it is possible to separate the failed output cell 4 from the other output cells 4. As a result, the fuse function can be built in the power device 1, making it possible to continue to operate the power device 1 even after the bonding wire 5 is cut.

Figure 4:
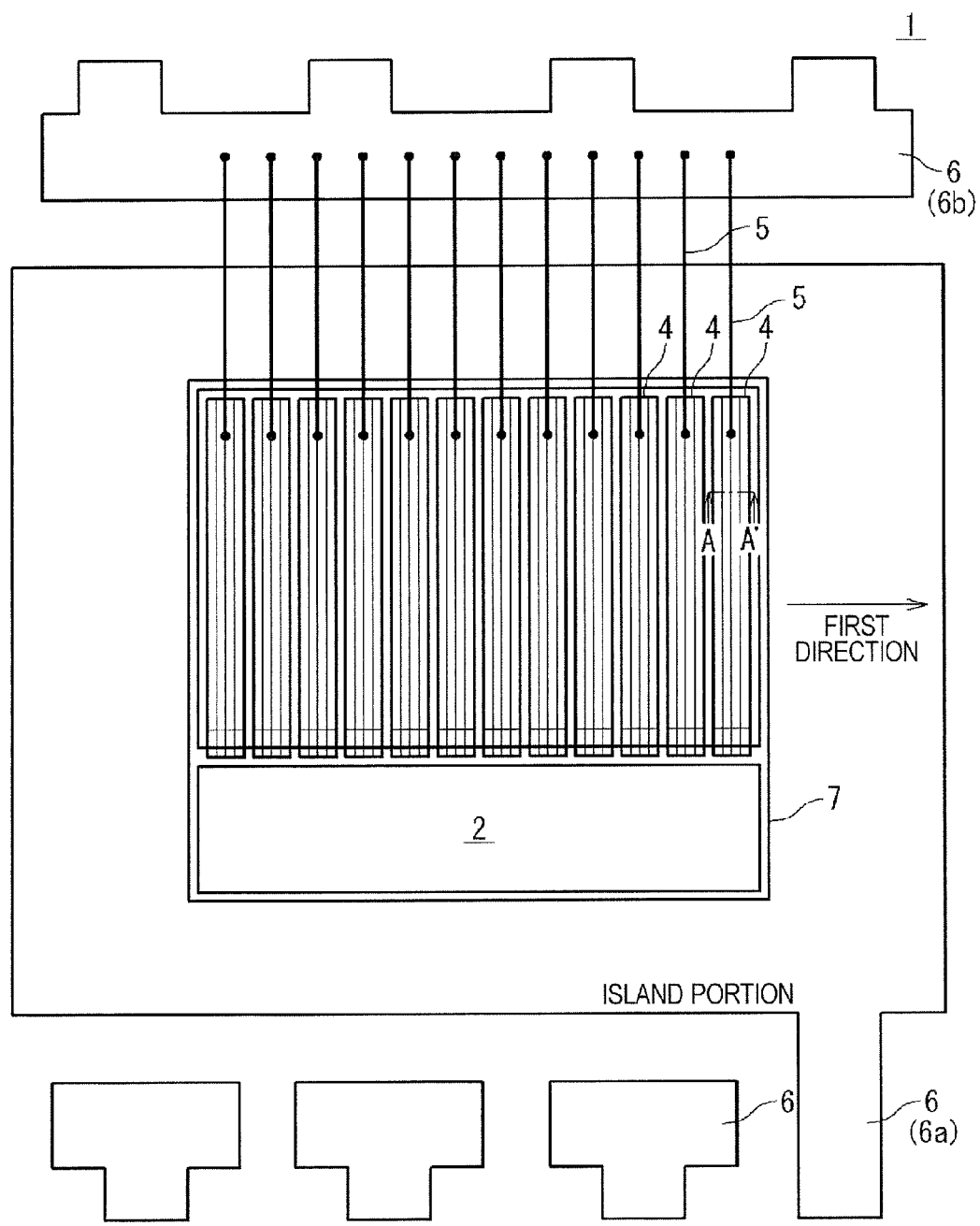
FIG. 4 is a block diagram of an example of the power device.

Next, an example of the configuration for realizing the power device 1 will be described. FIG. 4 is a view of an example of the configuration of the power device 1. In the example shown in FIG. 4, the power device 1 is realized by a package (PKG) of a so-called 8-pin small outline package (SOP). As shown in FIG. 4, the power device 1 includes the lead frame 6 and the semiconductor chip 7. The semiconductor chip 7 is mounted on the island portion of the lead frame 6 that serves as a first power source terminal 6a. The semiconductor chip 7 is provided with the control circuit 2 and the output cells 4. The output cells 4 (12 output cells in the example shown in FIG. 4) are arranged along a first direction. Each of the output cells 4 is coupled to the lead frame 6 that serves as an output terminal 6b through the corresponding bonding wire 5.

Figure 5:
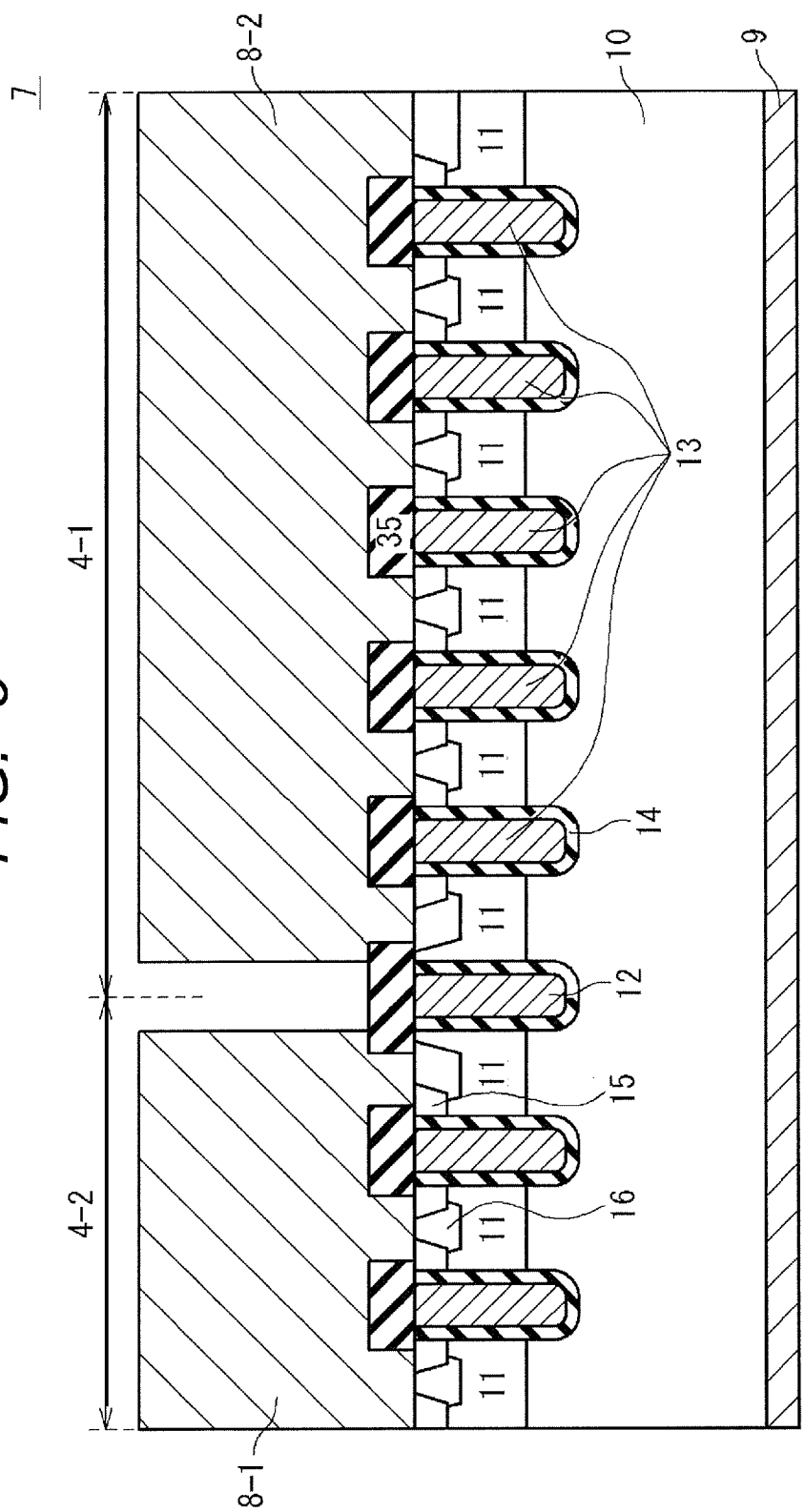
FIG. 5 is a cross-sectional view taken along line AA' shown in FIG. 4.

FIG. 5 is a cross-sectional view taken along line A-A' shown in FIG. 4. FIG. 5 shows the cross sectional structure of the output transistor 3, showing MOSFET as an example, included in the output cells 4-1 and 4-2. As shown in FIG. 5, the semiconductor chip 7 is formed from a semiconductor substrate. The semiconductor substrate includes a drain region 10, a base region 11, a plurality of gate electrodes 13, a back gate contact region 16, and a source region 15. A back electrode 9 is provided on the back side of the drain region 10. The base region 11 is provided on the main surface of the drain region 10. Each of the gate electrodes 13 is formed in the semiconductor substrate so as to reach the drain region 10 from the main surface side of the base region 11. In other words, each of the gate electrodes 13 has a trench structure. Further, each of the gate electrodes 13 is covered with a gate oxide film 14. The back gate contact region 16 is located in the center between two adjacent gate electrodes 13 on the main surface side of the base region 11. The source region 15 is located between the back gate contact region 16 and each of the gate electrodes 13. Further, source electrodes 8 (8-1, 8-2) are provided on the main surface of the semiconductor substrate. The source electrodes 8 are brought into contact with the back gate contact region 16 and the source region 15, respectively. However, an insulating layer 35 is formed on the semiconductor substrate so that each of the gate electrodes 13 is not brought into contact with the source electrodes 8. Further, the source electrodes 8-1 and 8-2 are separated in the region between the adjacent output cells 4 (4-1 and 4-2). Further, a dummy gate 12 is formed in the trench structure between the adjacent output cells 4. At this time, the dummy gate 12 is designed to be provided the same potential as that of one of the source electrodes (8-1 or 8-2) of the adjacent output cells 4. The periphery of the dummy gate 12 is also covered with the gate oxide film 14. Further, the source region 15 is not formed around the dummy gate 12. Incidentally, FIG. 2 shows that the semiconductor chip 7 includes a plurality of drain electrodes, the drain region 10 formed in a single semiconductor region functions as the plurality of drain electrodes. Thus, a part of the drain region 10 belonging in the output cell 4-1 functions as the drain electrode of the output transistor 3-1, and a part of the drain region 10 belonging in the output cell 4-2 functions as the drain electrode of the output transistor 3-2. Note that not only MOSFET but also IGBT or other switching devices can be used for the output transistor 3.

The power device 1 according to this embodiment shown in FIG. 2 is realized by adopting the structure shown in FIG. 5. In the example shown in FIG. 5, the dummy gate 12 is provided in the region between the adjacent output cells 4, so that the transistor provided between the adjacent output cells 4 is not destroyed. Further, even if the dummy gate is destroyed, the current flows through the source electrode (8-1 or 8-2) from which the gate potential of the dummy gate is provided. Thus, the dummy gate can be separated by fusing the bonding wire 5, similarly to the case where any other output cell 4 is destroyed.

Further, in the example shown in FIG. 4, the 8-pin SOP PKG is used for the power device 1. However, the power device 1 can also be realized by other packages.

Next, the design method of the individual bonding wires 5 will be described. As described above, each of the bonding wires 5 is designed to be fused and cut if the current is concentrated in the corresponding output transistor 3 and flows through it (when the corresponding output transistor 3 fails due to a short circuit). For example, it is possible to determine the magnitude of the current by which each of the bonding wires 5 is fused and cut by setting the wire diameter of the bonding wires 5 to an appropriate value. In this way, each of the bonding wires 5 can be designed to be cut at the moment when the temperature of the destroyed part reaches a predetermined temperature. In other words, the wire diameter of the bonding wires 5 can be designed to be cut before the temperature of the destroyed part reaches the point at which the destroyed part expands (for example, about 200° C. to 250° C.). This temperature depends on the load conditions and the thermal resistance.

Figure 6:
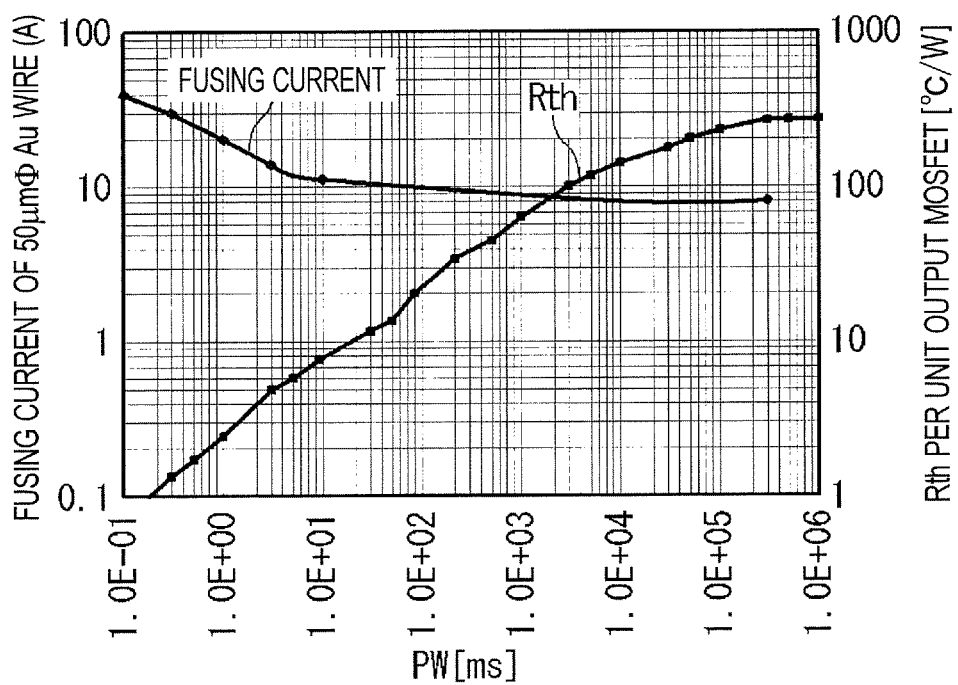
FIG. 6 is a graph of the relationship of the current flow time (PW), the fuse current, and the thermal resistance Rth.

FIG. 6 is a graph showing the relationship of the short circuit current flow time (PW), the fuse current of the bonding wire 5 with a 50 μm wire diameter, and the thermal resistance Rth when the transistor 3 fails. Here, it is assumed that the short-circuit resistance when the output transistor 3 fails is 100 mΩ. Further, it is also assumed that a current of 15 A is concentrated in the failed output transistor 3 and flows through it. The fuse current is 15 A in 3 msec after the particular output transistor 3 is shorted. In other words, each of the bonding wires 5 is fused and cut in 3 msec after the current of 15 A is concentrated in the failed part and flows through it. At this time, the thermal resistance Rth is 4.7° C./W. Further, the loss in the failed part is 22.5 W (the loss=the voltage in the failed part×the current in the failed part=15 A×100 mΩ×15 A). In other words, the temperature in the failed part at the time of fusing (3 sec after) is 105° C. (22.5 W×4.7° C./W=105° C.). Thus, in the example shown in FIG. 6, each of the bonding wires 5 is fused and cut when the temperature in the failed part reaches 105° C. Similarly, when the short-circuit resistance is 100 mΩ and the current of 50 A is concentrated in the failed part and flows through it (load short circuit), the wire cut time is 100 μsec, the loss is 250 W, and the thermal resistance is 0.7° C./W. As a result, each of the bonding wires 5 is cut when the temperature in the failed part reaches 175° C.

Figure 7:
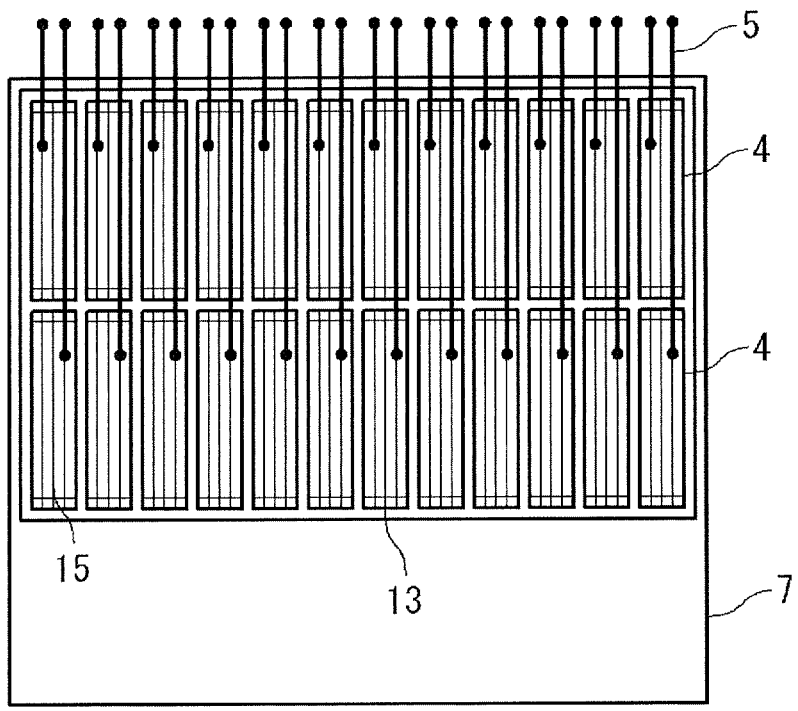
FIG. 7 is a view of an example of the layout of a plurality of output cells.

By taking advantage of the relationship described above, it is possible to fuse and cut each of the bonding wires 5 at the moment when the temperature of the failed part reaches a desired value. Note that in order to cut each of the bonding wires 5 with a low temperature of the failed part, it is necessary to set the wire diameter of the bonding wires 5 to a small value. When the wire diameter is small, the fuse current is small, so that the wire is cut with a low heat value. However, when the wire diameter is small, the ON resistance Ron of the power device 1 may not satisfy the required value. In such a case, the requirements for the ON resistance Ron can be satisfied by increasing the number of output cells 4. FIG. 7 is a view of an example of the layout of the output cells 4. In the example shown in FIG. 7, 24 output cells 4 are provided. The 24 output cells 4 are arranged in two rows by 12 columns. In this way, by increasing the number of output cells 4, the wire diameter of the individual bonding wires 5 can be reduced, so that each of the bonding wires 5 can be cut at the stage where the temperature of the failed part is low. According to this embodiment, the drain electrode common to the output transistors is coupled to the first power source. Then, the source electrodes are formed in the individual output cells. Then, each of the source electrodes is coupled to the output terminal through each of the corresponding bonding wires. With this configuration, even if a short circuit occurs, only the shorted cell can be separated from the other cells, so that the function of the power device 1 can be maintained.

Second Embodiment

Next, a second embodiment will be described. In the second embodiment, the configuration of the control circuit 2 is improved compared to that of the first embodiment. The configuration and operation except the control circuit 2 are similar to those of the first embodiment, and so the details will be omitted here.

Figure 8:
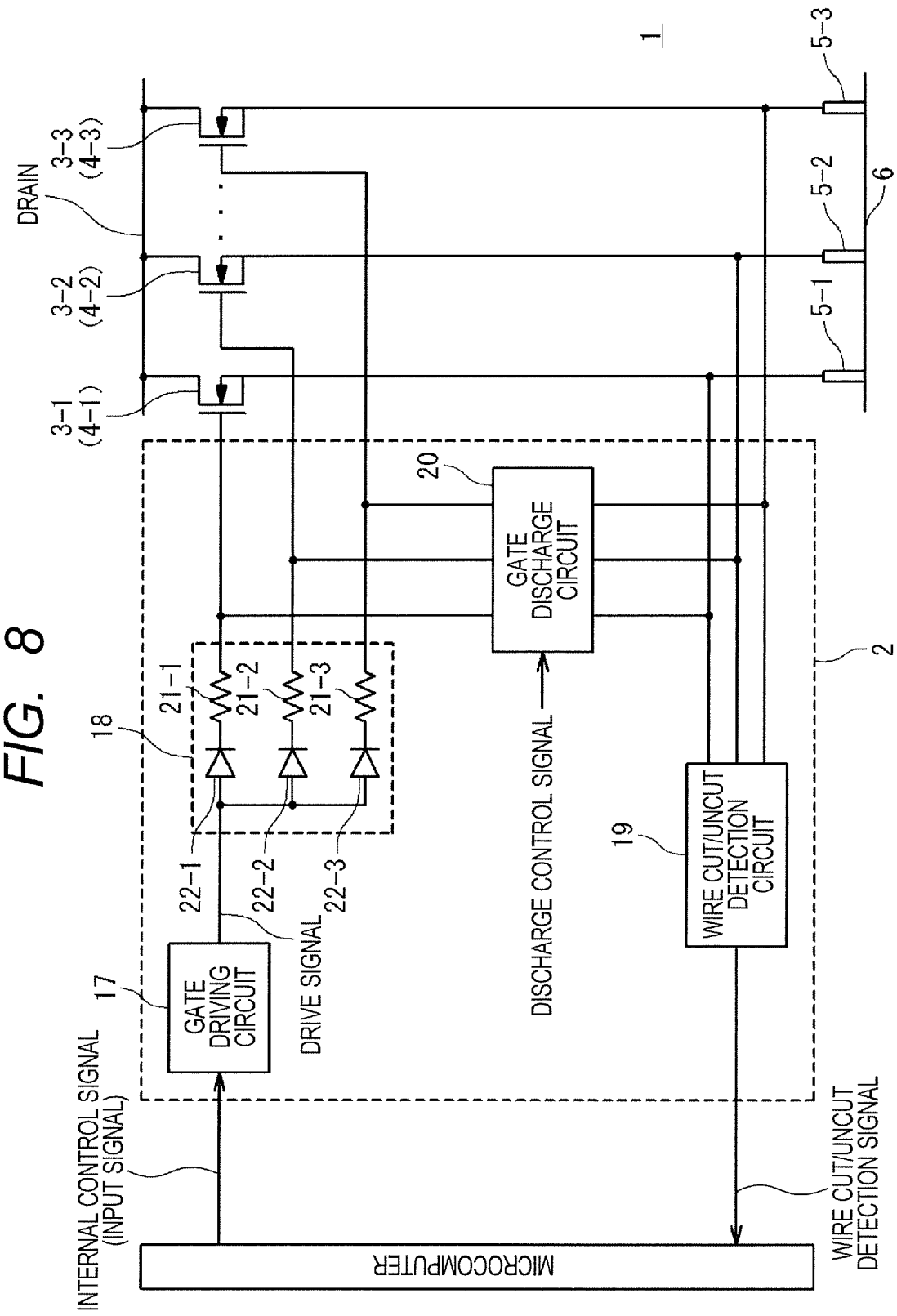
FIG. 8 is a schematic diagram of a power device according to a second embodiment.

FIG. 8 is a schematic diagram of the power device 1 according to the second embodiment. In this embodiment, the control circuit 2 includes a gate (control terminal) driving circuit 17, a gate (control terminal) separation circuit 18, a gate (control terminal) discharge circuit 20, and a wire cut/uncut detection circuit 19.

The gate driving circuit 17 has a function of controlling the output transistors 3 by supplying a drive signal to the gates (control terminals) of the output transistors 3 (the output cells 4). The gate driving circuit 17 obtains an input signal from the microcomputer, generates a drive signal based on the input signal, and supplies the drive signal to the gates of the output transistors 3. The output terminal of the gate driving circuit 17 is coupled to the output transistors 3 through the gate separation circuit 18. For example, the gate driving circuit 17 comprises a charge pump circuit.

The gate separation circuit 18 is provided to prevent the gate voltage of the failed output transistor 3 from affecting the gate voltage of the other output transistors 3. When a failure occurs, a short circuit between the gate (control terminal) and the drain (a first side terminal), which is hereinafter referred to as GD short, or a short circuit between the gate and the source (a second side terminal), which is hereinafter referred to as GS short, may occur in the failed output transistor 3. Here, the gate voltage of the output transistors 3 is commonly controlled by the gate driving circuit 17. Thus, the gates of the output transistors 3 may be coupled to each other. In such a case, when GD short or GS short occurs, the drive signal (output current) generated by the gate driving circuit 17 is drawn into the gate of the failed output transistor 3 in the ON state. As a result, the gate voltage of the other output transistors 3 is reduced and all of the other output transistors 3 may be turned off. In other words, the power device 1 may not operate normally. Further, when GD short occurs, the gate voltage of the failed output transistor 3 may be applied to the gates of the other output transistors 3 in the OFF state. As a result, all of the other output transistors 3 may be turned on. For this reason, the gate separation circuit 18 is provided in this embodiment.

As shown in FIG. 8, the gate separation circuit 18 includes a plurality of diodes 22 (22-1, 22-2, 22-3) and a plurality of resistive elements 21 (21-1, 21-2, 21-3). The diodes 22 (22-1, 22-2, 22-3) are provided corresponding to the respective output transistors 3 (3-1, 3-2, 3-3). Each of the diodes 22 is placed between the output node of the gate driving circuit 17 and the gate of the corresponding output transistor 3. Further, each of the resistive elements 21 (21-1, 21-2, 21-3) is placed between each of the corresponding diodes 22 (22-1, 22-2, 22-3) and the gate of each of the corresponding output transistors 3 (3-1, 3-2, 3-3). Note that each of the diodes 22 used herein has a reverse voltage that is greater than the rated voltage.

As described above, the individual diodes 22 are provided, so that even if DG short occurs, it is possible to prevent the gate voltage of the failed output transistor 3 from being applied to the gates of the other output transistors 3 in the OFF state. Thus, the OFF state of the other output transistors 3 can be maintained. Further, the individual resistive elements 21 are provided, so that when GD short or GS short occurs, it is possible to prevent the output current (drive signal) of the charge pump (the gate driving circuit 17) from being drawn into the destroyed part in the ON state. In this way, the ON state of the other output transistors 3 can be maintained.

Figure 9:
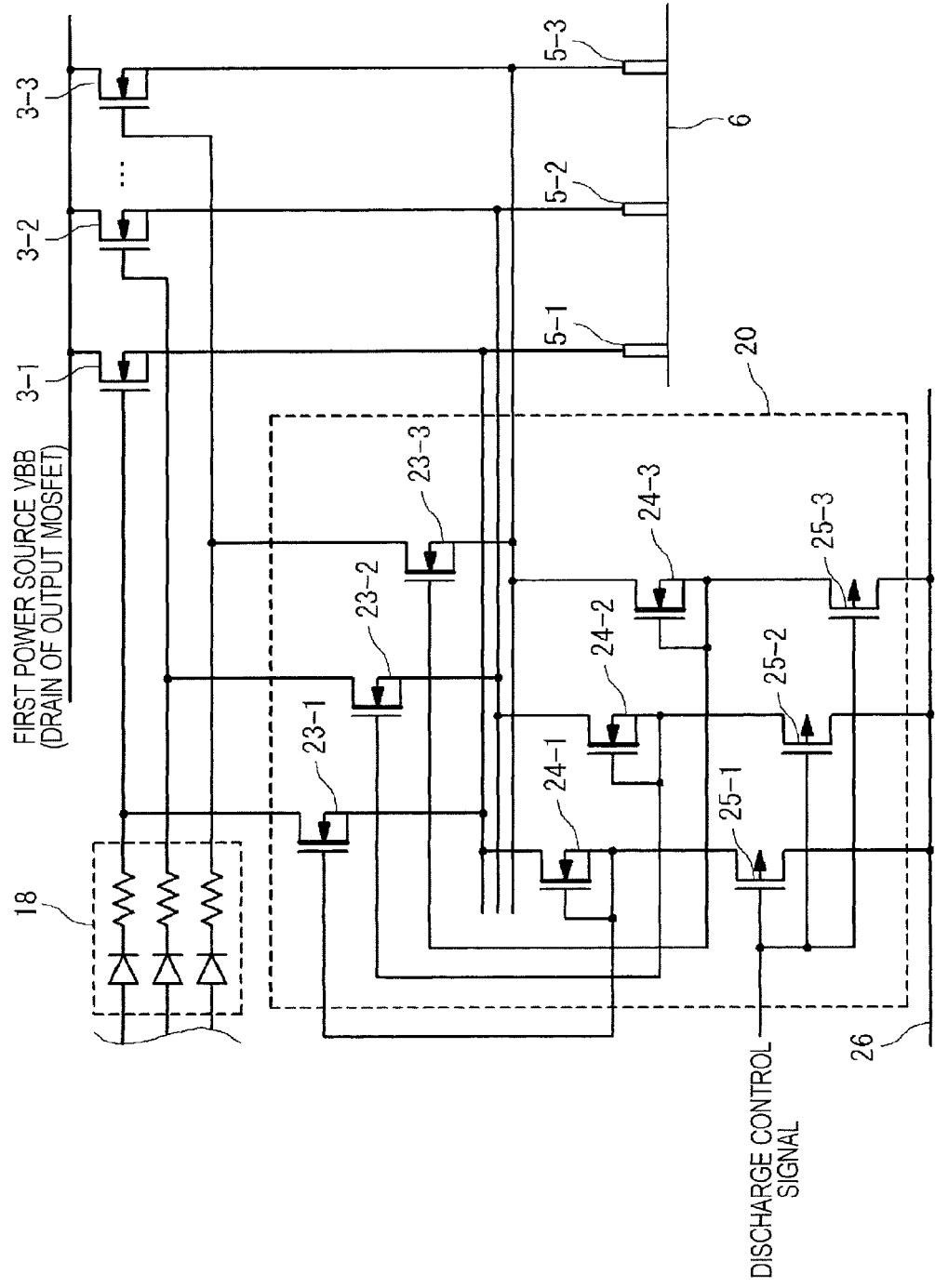
FIG. 9 is a circuit diagram of an example of a gate discharge circuit.

Next, the gate discharge circuit 20 will be described. The gate discharge circuit 20 is provided to discharge the gate charge of the output transistors 3 to get turned off. FIG. 9 is a circuit diagram of an example of the gate discharge circuit 20.

As shown in FIG. 9, the gate discharge circuit 20 includes a plurality of transistors 23 (23-1 to 23-3), a plurality of transistors 24 (24-1 to 24-3), and a plurality of transistors 25 (25-1 to 25-3). The transistors 23 (23-1 to 23-3) are provided corresponding to the respective output transistors 3 (3-1 to 3-3). Further, the transistors 24 (24-1 to 24-3) are provided corresponding to the respective transistors 3 (3-1 to 3-3). Also, the transistors 25 (25-1 to 25-3) are provided corresponding to the respective transistors 3 (3-1 to 3-3). Each of the output transistors 23 is a depletion type N-channel transistor, which is coupled between the gate and source of the corresponding output transistor 3. Each of the transistors 24 is also a depletion type N-channel transistor, which is coupled between the source of the corresponding transistor 3 and the gate of the corresponding transistor 23. Further, each of the transistors 25 is an enhancement type P-channel transistor, which is coupled between the gate of the corresponding transistor 23 and a second power source 26. Note that the potential of the second power source 26 is the midpoint potential (for example, VBB-6V) between the first power source potential VBB and the ground potential GND. Further, a discharge control signal generated by the control circuit 2 is supplied to the gates of the individual transistors 25. Further, the gate and the source are coupled in each transistor 24.

In the gate discharge circuit 20 shown in FIG. 9, a low level (for example, VBB-6V) voltage is supplied as a discharge control signal to the gates of the individual transistors 25 in the ON state (when the output transistors 3 are turned on). When the source potential of the output transistors 3 increases and exceeds the turn-on voltage of the individual transistors 25, each of the transistors 25 is turned on, and the gate potential of the individual transistors 23 changes to the potential of the second power source 26. As a result, the gate-source voltage Vgs becomes a negative voltage in each of the transistors 23. The individual transistors 23 are cut off. On the other hand, in the OFF state, a high level (VBB) voltage is supplied to the gates of the individual transistors 25. As a result, each of the transistors 25 is turned off, and the gate and source of the individual transistors 23 are coupled together through each of the transistors 24, respectively. In other words, the gate-source voltage Vgs changes to 0 V in each of the transistors 23. In this way, the gate charge of the individual output transistors 3 is discharged to the lead frame 6 through each of the transistors 23.

Note that the gate discharge circuit 20 is not limited to the circuit shown in FIG. 9. Other circuits can be adopted for the gate discharge circuit 20 as long as they can discharge the gate charge of the individual output transistors 3 in the OFF state.

Next, the wire cut/uncut detection circuit 19 (see FIG. 8) will be described. In this embodiment, the function of the power device 1 is maintained after each of the bonding wires 5 is fused and cut when a failure occurs. However, it is desirable to notify the user of the fact that the particular boding wire 5 is cut. Thus, when the wire cut/uncut detection circuit 19 detects that the particular bonding wire 5 is cut, it can be designed to notify the user of the detection result of the wire cut/uncut detection circuit 19 through the microcomputer.

In the ON state, the output transistors 3 are turned on. Thus, the source potential of the individual output transistors 3 is raised to the drain potential (first power source potential VBB). On the other hand, in the OFF state, the output transistors 3 are turned off, and the source potential of the individual output transistors 3 is drawn to the ground potential GND. When any of the output transistors 3 fails due to a short circuit, as described above, the bonding wire 5 coupled to the failed output transistor 3 is cut. The source potential of the failed output transistor 3 is raised to the drain potential (first power source potential VBB) even when in the OFF state. Thus, it is possible to detect whether a failure occurs (whether the bonding wire 5 is cut) by measuring the source potential of the individual output transistors 3 in the OFF state.

Now the wire cut/uncut detection circuit 19 will be described in detail below.

Figure 10:
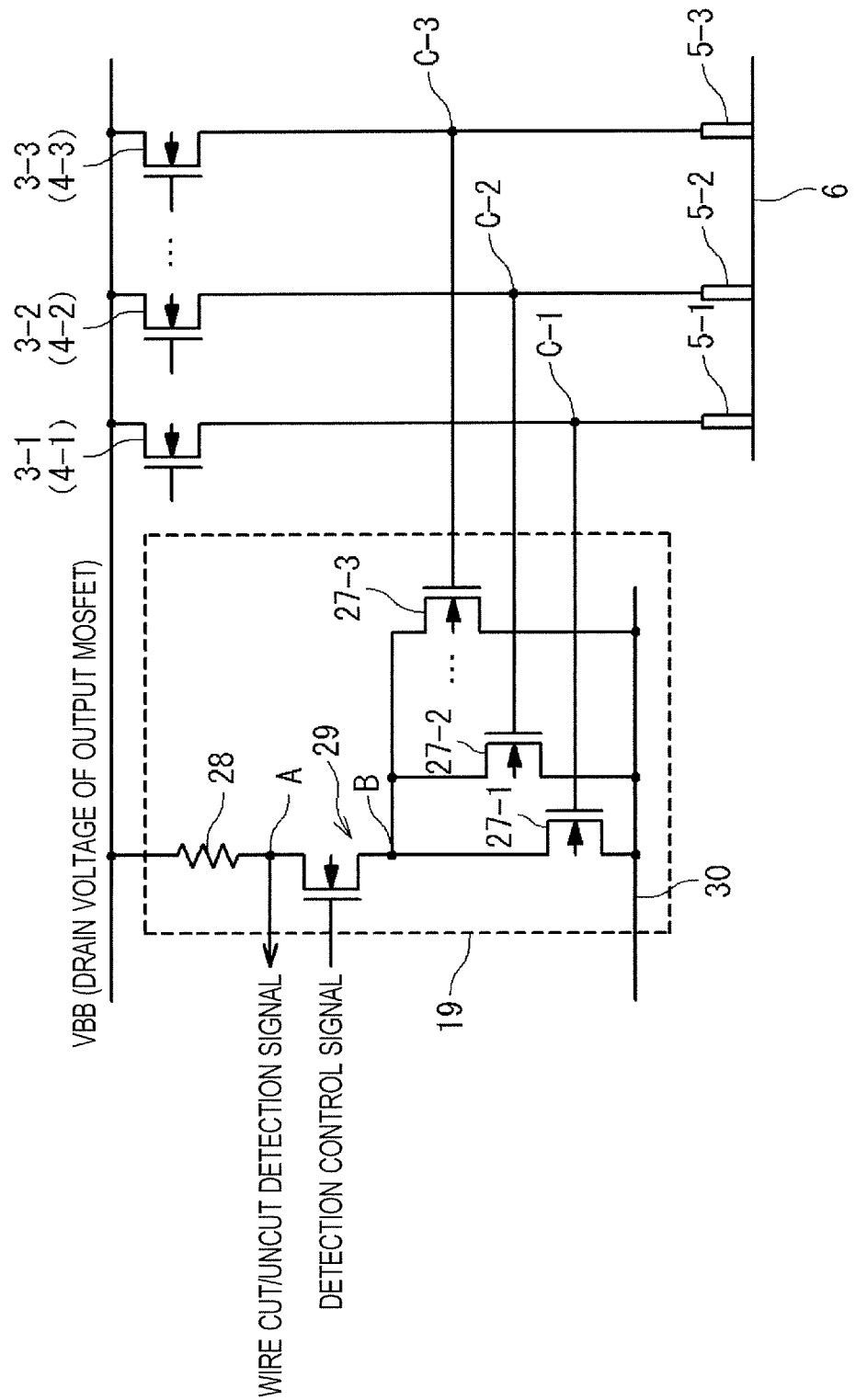
FIG. 10 is a schematic diagram of a wire cut/uncut detection circuit.

FIG. 10 is a schematic diagram of the wire cut/uncut detection circuit 19. As shown in FIG. 10, the wire cut/uncut detection circuit 19 includes a resistive element 28, a transistor 29, and a plurality of transistors 27 (27-1 to 27-3). The resistive element 28 is provided between the drain of the output transistors 3 and a node A. The transistor 29 is an N-channel type transistor, which is provided to switch the coupling between the node A and a node B. A detection control signal generated by the control circuit 2 is supplied to the gate of the transistor 29. The transistors 27 (27-1 to 27-3) are provided corresponding to the respective output transistors 3 (3-1 to 3-3). Each of the transistors 27 is an N-channel type transistor, which is provided to switch the electrical coupling between the node B and a third power source 30. The potential of the third power source 30 is, for example, the ground potential GND. The gate of each of the transistors 27 is coupled to each of nodes C (C-1 to C3) between the source of the corresponding output transistor 3 (3-1 to 3-3) and each of the corresponding bonding wire 5 (5-1 to 5-3). The potential of the node A is supplied as the wire cut/uncut detection signal to the microcomputer.

Next, the operation method of the wire cut/uncut detection circuit 19 will be described. When switching from the ON state to the OFF state, the control circuit 2 changes the detection control signal to high level H. In the OFF state, the source potential of the individual output transistors 3 becomes the ground potential GND. As a result, each of the transistors 27 is switched to the OFF state, and the potential of the node A shows the high level (first power source potential VBB). In other words, a high level signal is output as a normal state signal of the wire cut/uncut detection signal. On the other hand, when any of the output transistors 3 is shorted, the source potential of the failed output transistor 3 is raised to nearly the first power source potential VBB in the OFF state. Thus, the failed current flows into the failed output transistor 3, and the potential of the node A shows the low level. In other words, a low level signal is output as an abnormal state signal of the wire cut/uncut detection signal. The wire cut/uncut detection signal is transmitted to the microcomputer. The microcomputer obtains the low level signal as the abnormal state signal of the wire cut/uncut detection signal in the OFF state, and determines that the bonding wire 5 is cut. Then, the microcomputer notifies the user of the detection result.

Figure 11:
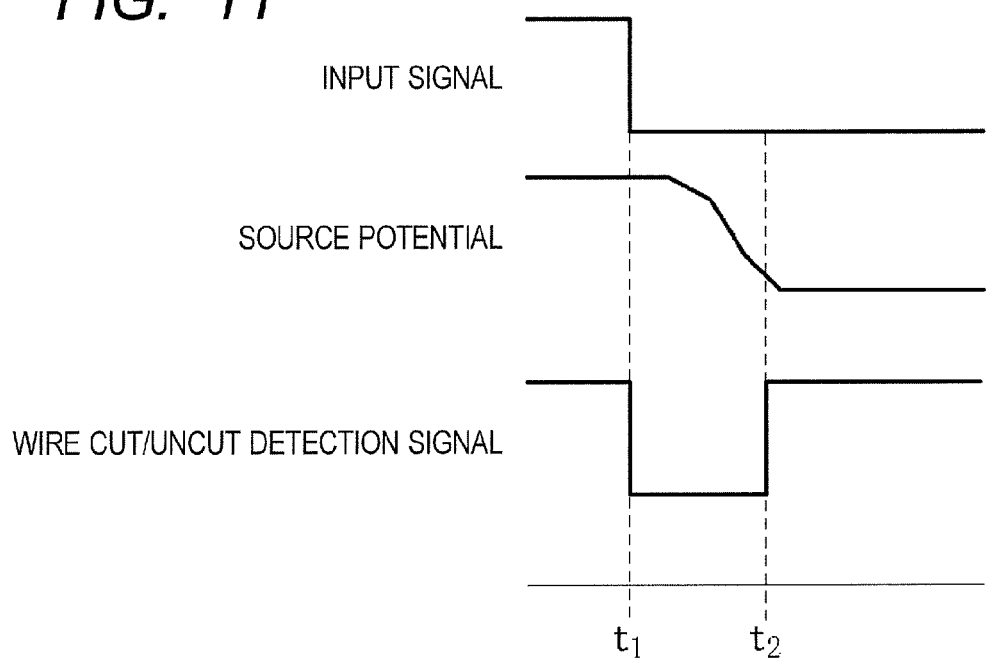
FIG. 11 is a timing chart showing an example of the waveforms of input signal, source potential, and wire cut/uncut detection signal.

In the embodiment shown here it is also designed to prevent false detection. More specifically, it is designed to improve the timing of the transistor 29 being turned on (the timing of the switching of the detection control signal). FIG. 11 is a timing chart showing an example of the waveforms of the input signal, the source potential, and the wire cut/uncut detection signal. In this example, the input signal is switched from a high level to a low level at the time t1. It is assumed that, in the example shown in FIG. 11, the detection control signal is changed to the high level at the time t1. As described above, the input signal is the signal supplied from the microcomputer to control the output transistors 3. In other words, at the time t1, the output transistors 3 are switched from the ON state to the OFF state. In this way, the source potential is switched from high level to low level. However, the source potential is not switched from high level to low level immediately at the time t1. The source potential is reduced over time from the time t1, and is reduced to nearly low level at the time t2. Thus, each of the transistors 27 is in the ON state during the period from the time t1 to the time t2. When the detection control signal is changed to the high level at the time t1, the low level signal is detected as the wire cut/uncut detection signal during the period from the time t1 to the time t2. In other words, a false detection occurs during the period from the time t1 to the time t2.

Figure 12:
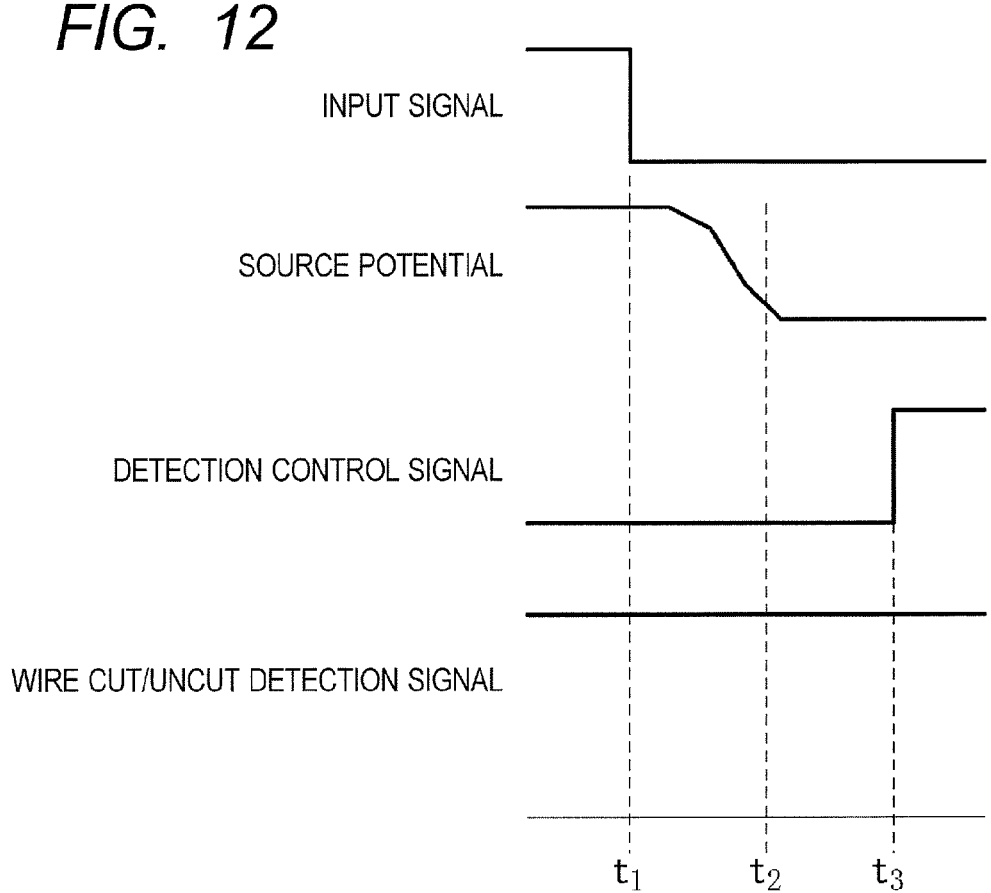
FIG. 12 is a timing chart showing the input signal, the source potential, the detection control signal, and the wire cut/uncut detection signal.

Thus, in this embodiment, the control circuit 2 switches the detection control signal from low level to high level after a predetermined time (time t3) has passed from the time t1. FIG. 12 is a timing chart showing the input signal, the source potential, the detection control signal, and the wire cut/uncut detection signal. The time t3 is set after the time t2 at which the source potential reaches the low level. With this operation method, the wire cut/uncut detection signal is not changed to the low level during the period from the time t1 to the time t3, thus preventing a false detection. FIG. 12 shows the state where the wire cut/uncut detection signal is maintained at the high level (no-failure state).

Further, when a failure occurs, the current to the load through the output transistor 3 may be excessive to the extent that the bonding wire 5 is not cut (partially short circuit state). Also in the case of this partially short circuit state, the source potential of the failed output transistor 3 has a certain level of potential, and the wire cut/uncut detection signal is changed to the low level. In this way, the microcomputer is notified that a failure has occurred. Thus, the user can be notified of the abnormality.

Third Embodiment

Figure 13:
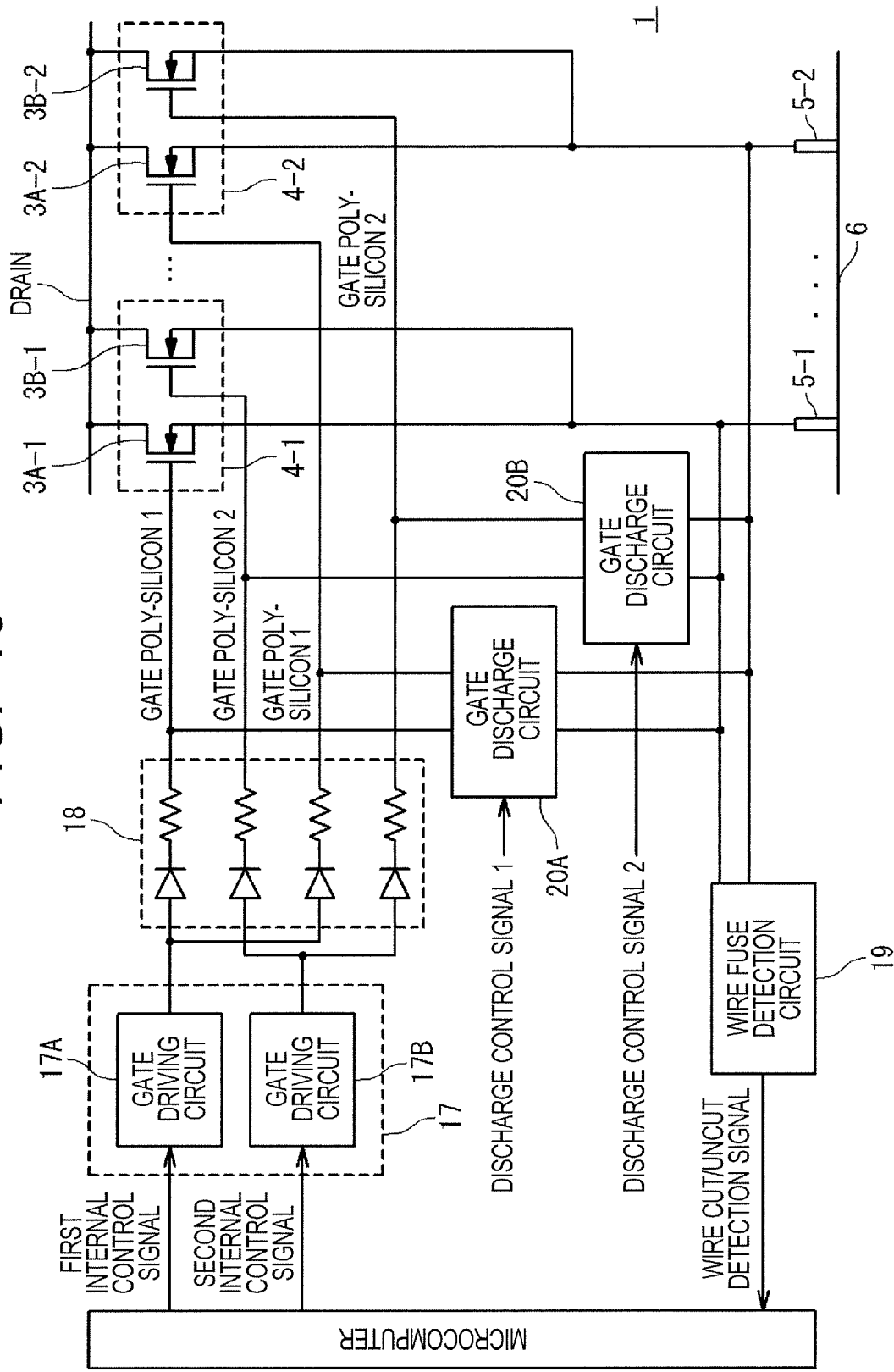
FIG. 13 is a schematic diagram of a power device according to a third embodiment.

Next, a third embodiment will be described. FIG. 13 is a schematic diagram of the power device 1 according to the third embodiment. In the above-described embodiments, as shown in FIG. 2, one output transistor 3 is provided to each of the output cells 4. On the other hand, in the third embodiment, two output transistors 3 (a first output transistor 3A and a second output transistor 3B) are provided in each of the output cells 4. In other words, a first output transistor 3A-1 and a second output transistor 3B-1 are provided in the output cell 4-1. Similarly, a first output transistor 3A-2 and a second output transistor 3B-2 are provided in the output cell 4-2. Further, the gate (control terminal) driving circuit 17 includes a first gate (control terminal) driving circuit 17A and a second gate (control terminal) driving circuit 17B. Also, the gate (control terminal) discharge circuit 20 includes a first gate discharge circuit 20A and a second gate discharge circuit 20B. The other configuration is similar to that of the second embodiment.

As shown in FIG. 13, the drains (first side terminals) of the output transistors (3A, 3B) in each of the output cells 4 are commonly coupled. Further, the sources (second side terminals) of the output transistors (3A, 3B) in each of the output cells 4 are coupled to each of the corresponding bonding wires 5.

Further, the first gate driving circuit 17A has a function of driving the first output transistors 3A included in the output cells 4. The first gate driving circuit 17A provides a signal to the gates (control terminals) of the first output transistors 3A in the output cells 4, based on the first internal control signal (first input signal). Thus, the first gate driving circuit 17A controls the first output transistors 3A. While the second gate driving circuit 17B has a function of driving the second output transistors 3B. The second gate driving circuit 17B provides a drive signal to the gates (control terminals) of the second output transistors 3B in the output cells 4, based on the second internal control signal (second input signal). Thus, the second gate driving circuit 17B controls the second output transistors 3B.

The first gate discharge circuit 20A has a function of discharging the gate charge of the first output transistors 3A included in the output cells 4. The second gate discharge circuit 20B has a function of discharging the gate charge of the second output transistors 3B included in the output cells 4. The first gate discharge circuit 20A discharges the gate charge of the first output transistors 3A based on a first discharge control signal. The second gate discharge circuit 20B discharges the gate charge of the second output transistors 3B based on a second discharge control signal. The circuit configuration of the individual gate discharge circuits 20 is similar to that of the second embodiment.

In this embodiment, the output cells 4 are controlled so that the current flowing through the individual output cells 4 is limited when a failure occurs. Similarly to the embodiments described above, also in this embodiment, when any of the output transistors 3 fails due to a short circuit, the bonding wire 5 coupled to the output cell 4 including the failed output transistor 3 is fused and cut. In this way, it is possible to prevent that the current is concentrated in the failed output cell 4 and flows through it. However, even if the bonding wire 5 is cut, an excess current may be allowed to flow through the failed output transistor 3 depending on a current path of the short circuit. Thus, in this embodiment, the first internal control signal or the second internal control signal is set so that when one of the first output transistor 3A and the second output transistor 3B fails, the other output transistor is switched to the OFF state. In this way, even if the current flows through one of the first output transistor 3A and the second output transistor 3B due to a failure in each of the output cells 4, the other output transistor is controlled to be turned off. As a result, it is possible to reduce the current flowing through the failed output cell 4 to half.

Figure 14:
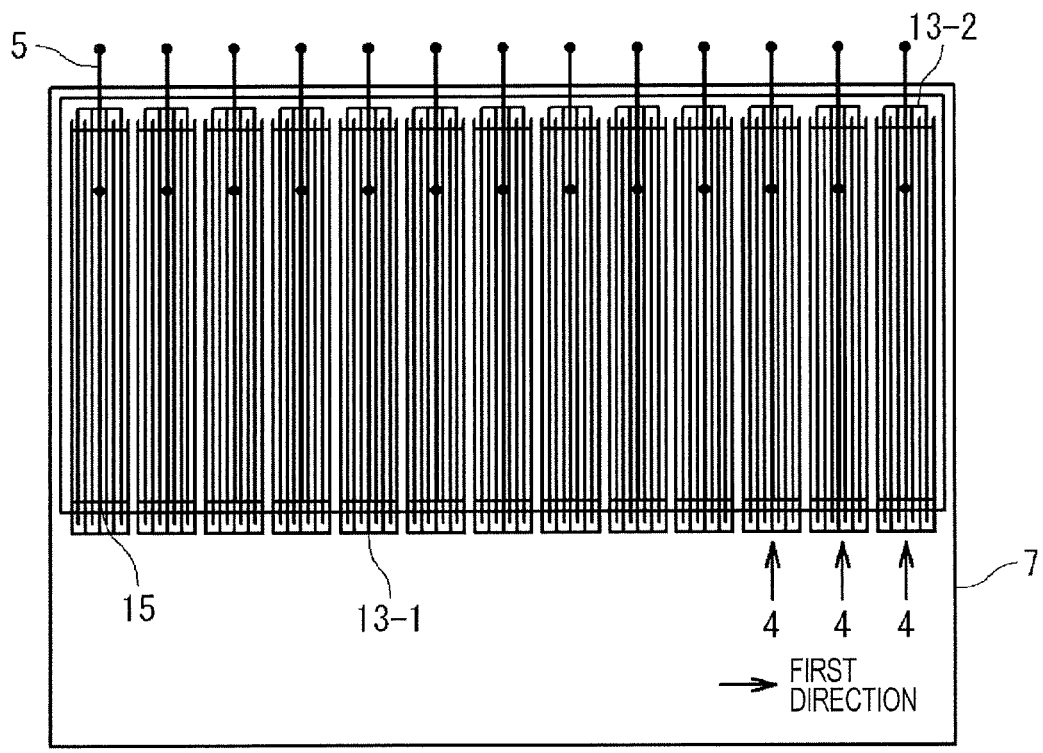
FIG. 14 is a view of an example of the layout for achieving the power device according to the third embodiment.
Figure 15:
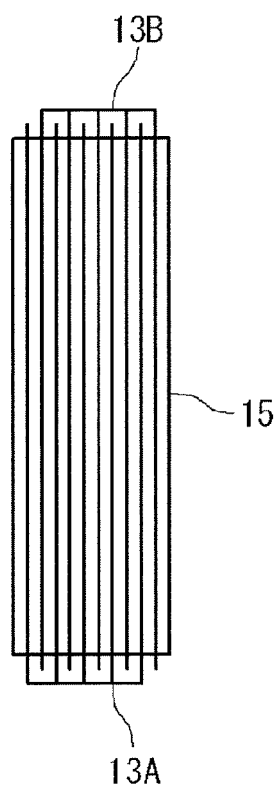
FIG. 15 is a schematic diagram of the layout of each output cell.

FIG. 14 is a view of an example of the layout to achieve the power device 1 according to the third embodiment. In the example shown in FIG. 14, a plurality of output cells 4 (12 output cells 4 are shown) are arranged along the first direction on the semiconductor chip 7. Note that the cross sectional structure of the individual output cells 4 is similar to that of the first embodiment (see FIG. 5). However, it is designed to improve the layout of the gate electrodes 13. FIG. 15 is a schematic diagram of the layout of the output cell 4. As shown in FIG. 15, a gate electrode 13A of the first output transistor 3A, as well as a gate electrode 13B of the second output transistor 3B have a comb-like shape. The gate electrode 13A and the gate electrode 13B are staggered with respect to each other. By using such a configuration, the power device 1 shown in FIG. 14 is realized.

Fourth Embodiment

Next, a fourth embodiment will be described. In the first embodiment, as shown in FIG. 1, the power device 1 is provided between the upstream unit or battery and the load. This embodiment describes the power device 1 used in a different location.

Figure 16:
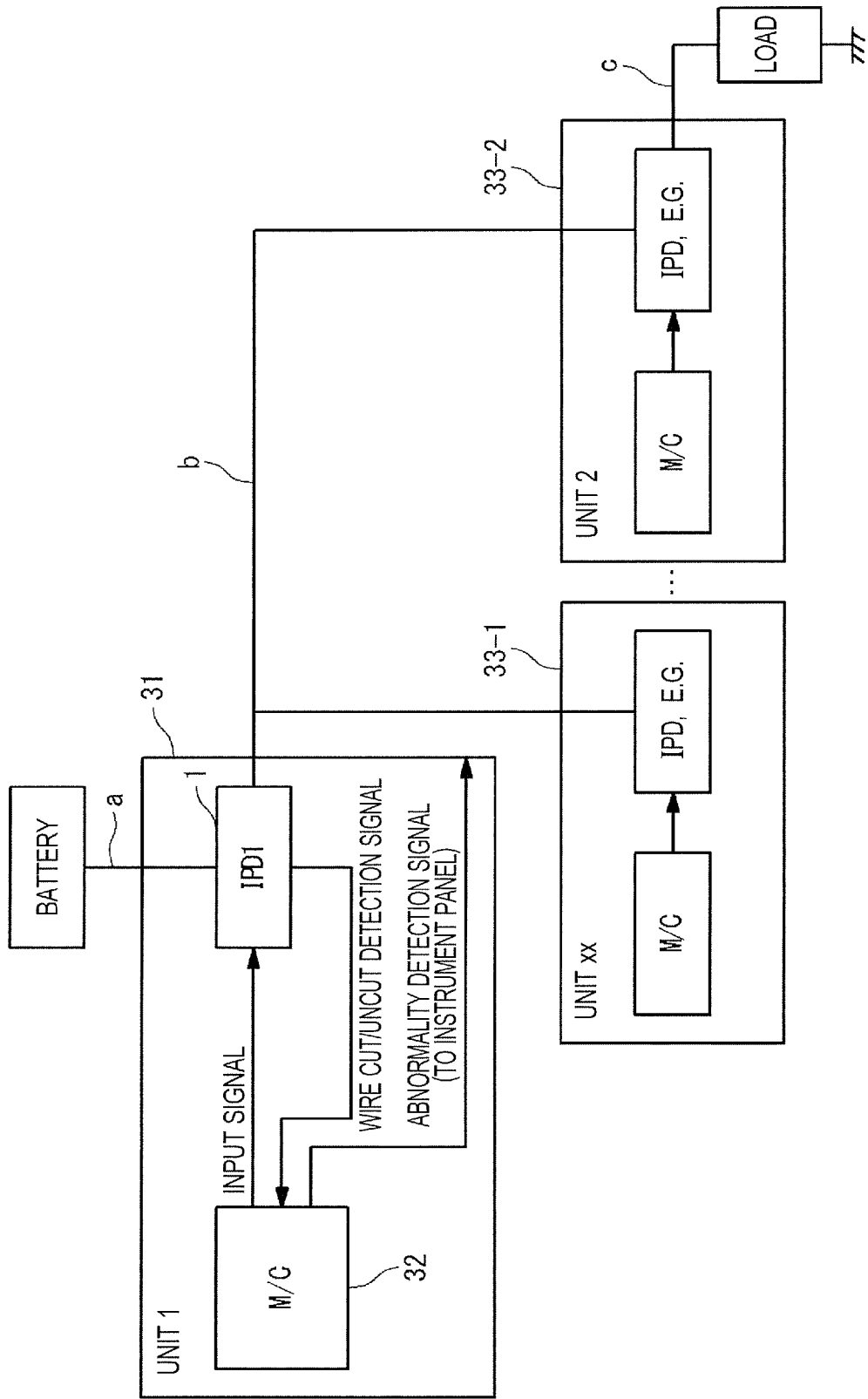
FIG. 16 is a schematic diagram of a power control system according to a fourth embodiment.

FIG. 16 is a schematic diagram of a power control system in which the power device 1 according to this embodiment is built. The power control system includes a power control unit 31 as the upstream unit, and a plurality of lower unit 33 (33-1, 33-2). The power device 1 described in the above embodiments is built in the power control unit 31. The power device 1 is coupled to a battery through a line a, and coupled to the lower units 33 through a line b. Further, each of the lower units 33 is coupled to the corresponding load through a line c. However, FIG. 16 only shows the load coupled to the lower unit 33-2 for simplification. In this embodiment, the supply of the power from the battery to each of the lower units 33 is controlled by the power device 1 provided in the power control unit 31. Here, the power device mounted in the individual lower units 33 does not necessarily have the fuse function that is required for the power device 1, and common devices such as IPD, power MOSFET, and IGBT can be used here. Of course, the power device having the fuse function can also be used in the lower units 33.

In other words, the power control unit 31 is provided as a relay. A fuse may be provided for fail-safe between the relay and the battery. However, in this embodiment, since the power device 1 has the fuse function, the fuse between the relay (the upstream unit) and the battery can be omitted. In this way, the number of parts can be reduced, the wire harness can be reduced, and thus lightweight system can be achieved.

Figure 17:
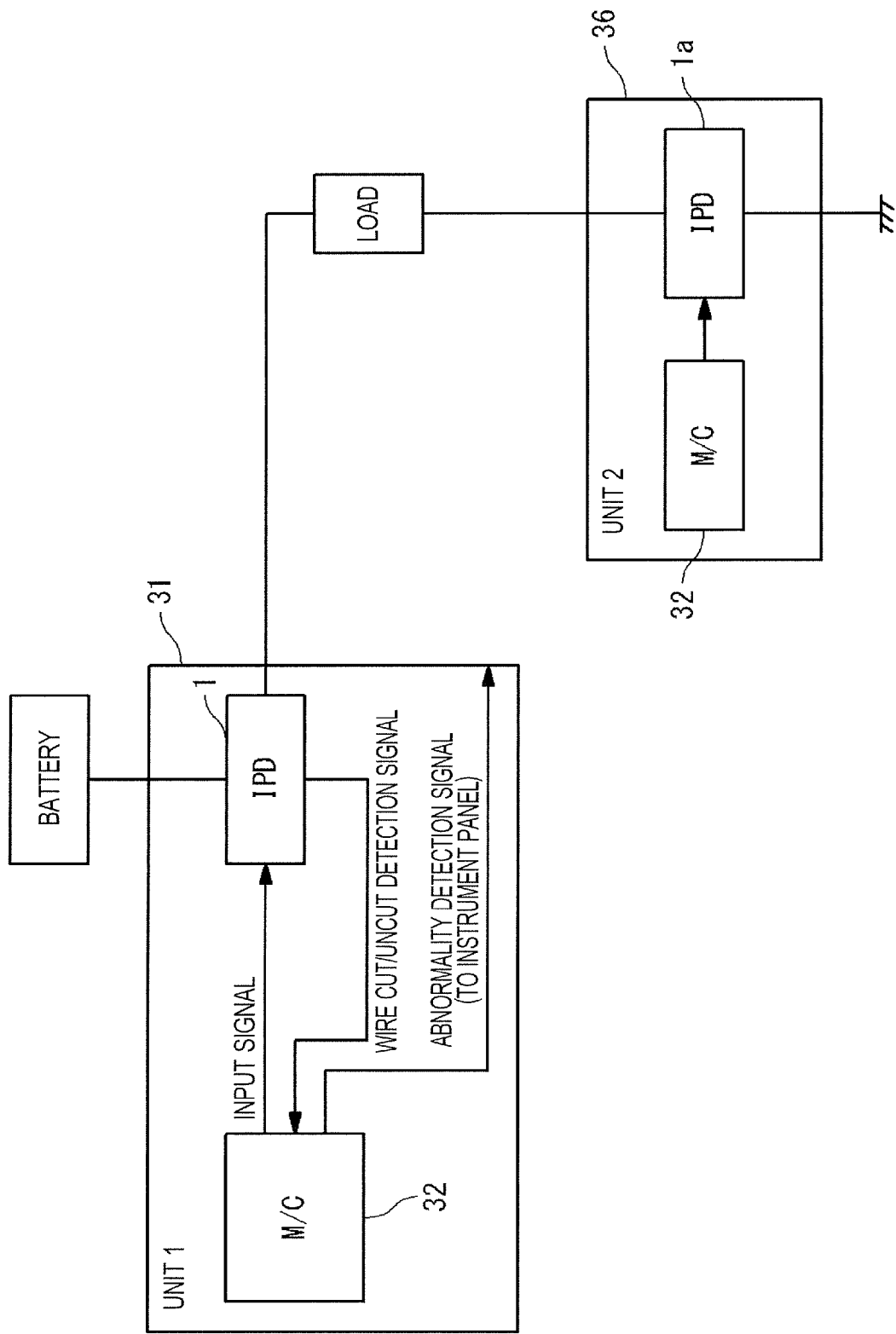
FIG. 17 is a schematic view of a power control system according to a modification of the fourth embodiment.

Next, a modification of the fourth embodiment will be described. FIG. 17 is a schematic view of a power control system in which the power device 1 according to the modification is built. The power control system includes a power control unit 31 as an upstream unit, and a downstream unit 36. The power control unit 31 is provided between the battery and the load. The downstream unit 36 is provided between the load and the ground. Then, the power control unit 31 is also provided with a power device 1 having a fuse function, which is similar to that of the power device 1 described in the above embodiments. Also, with this configuration, the fuse function that is essentially required can be built in the power device 1. As a result, the number of parts can be reduced and light weight can be achieved. Note that the power device 1a of the downstream unit 36 does not necessarily have the fuse function, and common devices such as IPD, power MOSFET, and IGGBT can be used.

While the present invention has been described using the first to fourth embodiments, it is to be noted that these embodiments and modification are not independent of each other and can be combined within a consistent range. Further, the present invention is not limited to the above embodiments and various changes and modifications can be made within the spirit and scope of the present invention.

What is claimed is:
1. A power control unit for use in an automobile, comprising:
   a power device adapted to drive a load of the automobile, the power device including a first lead frame having a semiconductor chip mounted thereon, the first lead frame including a power source terminal adapted to couple with a battery, the semiconductor chip including a plurality of transistors coupled with the first lead frame and a second lead frame, the second lead frame being coupled with the load, each of the plurality of transistors is separately coupled with the second lead frame via a corresponding bonding wire, each bonding wire having a first end directly connected to one of the plurality of transistors and a second end directly connected to the second lead frame,
   a control circuit for controlling each of the plurality of transistors; and
   a microcomputer for controlling the power device.

2. The power control unit according to claim 1, wherein the microcomputer supplies an input signal to the power device to control the power device,
wherein the power device enables or disables a supply of power to the load from the battery based on the input signal.

3. The power control unit according to claim 2,
wherein the microcomputer supplies the input signal to the control circuit of the power device.

4. The power control unit according to claim 1,
wherein the load is an engine of the automobile.

5. The power control unit according to claim 1,
wherein in response to a transistor from among the plurality of transistor being short-circuited, the bonding wire corresponding to the short-circuited transistor is fused and cut.

6. The power control unit according to claim 1,
wherein each of the plurality of transistors is a MOSFET.

7. The power control unit according to claim 6,
wherein each of the plurality of transistors is an n-channel MOSFET,
wherein a drain electrode of said each of the plurality of transistors is coupled with the first lead frame and a source electrode of said each of the plurality of transistors is coupled with the second lead frame.

8. The power control unit according to claim 6,
wherein a gate electrode of said each of the plurality of transistors is provided in a trench formed over a semiconductor substrate.

9. The power control unit according to claim 1, further comprising a wire cut/uncut detection circuit generating a wire cut/uncut detection signal that indicates whether any one of the bonding wires is cut or none of the bonding wires is cut.

10. The power control unit according to claim 1, further comprising a control terminal separation circuit,
wherein when a transistor from among the transistors is short-circuited, the control terminal separation circuit reduces the influence of a control terminal voltage of the short-circuited transistor on a control terminal voltage of the other transistors.

11. The power control unit according to claim 1, further comprising a control terminal separation circuit and a control terminal driving circuit configured to supply a drive signal to a control terminal of the respective transistors,
wherein the control terminal separation circuit includes a plurality of diodes and a plurality of resistive elements,
wherein the diodes and the resistive elements are provided corresponding to the transistors, and
wherein each of the diodes as well as each of the resistive elements are provided between an output terminal of the control terminal driving circuit and the control terminal of the corresponding transistor.

12. The power control unit according to claim 1, further comprising:
a control terminal driving circuit configured to supply a drive signal to a control terminal of the respective transistors; and
control terminal discharge circuit configured to discharge charges of the control terminal of the transistors to switch the transistors to an OFF state.

13. A power control unit comprising:
a first transistor and a second transistor each being mounted to a first lead frame that is connected to a battery;
a first bonding wire that forms a sole and direct electrical connection between the first transistor and a second lead frame connected to a load;
a second bonding wire that forms a sole and direct electrical connection between the second transistor and the second lead frame;
a control circuit for controlling the first transistor and the second transistor; and
a microcomputer for controlling a power device that controls the first and second transistors.

14. The power control unit according to claim 13, wherein in response to the first transistor malfunctioning, the electrical connection between the first transistor and the second lead frame is broken.

* * * * *